United States Patent [19]
Morita et al.

[11] Patent Number: 5,821,568
[45] Date of Patent: Oct. 13, 1998

[54] CLEAVED SEMICONDUCTOR DEVICE WITH {11-20} PLANE

[75] Inventors: Etsuo Morita; Hiroji Kawai, both of Kanagawa, Japan

[73] Assignee: Sony Corporation, Tokyo, Japan

[21] Appl. No.: 769,708

[22] Filed: Dec. 18, 1996

[30] Foreign Application Priority Data

Dec. 19, 1995 [JP] Japan ..................................... 7-330779

[51] Int. Cl.⁶ .................................................. H01L 33/00
[52] U.S. Cl. ................................ 257/94; 257/95; 257/96; 257/97; 257/103
[58] Field of Search ................................. 257/94, 95, 96, 257/97, 103; 372/43, 44

[56] References Cited

U.S. PATENT DOCUMENTS

| | | | |
|---|---|---|---|
| 4,567,393 | 1/1986 | Asai et al. | 310/313 A |
| 5,571,603 | 11/1996 | Utumi et al. | 428/212 |

FOREIGN PATENT DOCUMENTS

| | | |
|---|---|---|
| 407249831 | 9/1995 | Japan . |
| 408264881 | 10/1996 | Japan . |

*Primary Examiner*—William Mintel
*Attorney, Agent, or Firm*—Hill & Simpson

[57] ABSTRACT

A semiconductor device such as a semiconductor layer is formed of a compound semiconductor layer of III-V group such as GaN. In the case where the substrate has not any planes that are easy to cleave which coincides with an easy-to-cleave plane of a semiconductor layer grown on the substrate or the substrate easily succumbs to cleavage, then the semiconductor layer together with the substrate can be broken into chips in an easy-to-cleave plane. The cleaved surface of the semiconductor layer can be positively formed as an optically superior surface. A compound semiconductor layer 2 containing at least one of the elements {Ga, Al, In} and N is formed on the substrate 1. This compound semiconductor layer 2 has a pair of facets of {11–20} plane substantially perpendicular to the substrate 1.

8 Claims, 4 Drawing Sheets

CLEAVED SEMICONDUCTOR DEVICE WITH {11-20} PLANE

BACKGROUND OF THE INVENTION

1. Field of the Invention

The present invention relates to a semiconductor device and a method of fabricating such a semiconductor device that is suitably applicable to a semiconductor laser.

2. Description of the Related Art

To generate an inductive emission in a semiconductor device such as a compound semiconductor laser, a pair of optical facets are required to enclose and reflect the light on the two sides of the light emitting area and to form a resonator between the facets.

These facets are formed generally by a cleaved surface that is perpendicular to a crystal substrate or a semiconductor layer that is epitaxially grown on the crystal substrate using the cleavage of a crystal. In this case, a scratch is formed by marking on the front surface of a semiconductor layer or on the reverse side of a substrate to determine a point wherefrom cleavage is started. The facet could instead be formed by other methods, for example, RIE (reactive ion etching) or chemical wet etching. In general, a facet formed by these methods is optically inferior to a cleaved facet. Also, the etching process is very complicated and has an adverse effect on mass productivity.

When cleavage is used as mentioned above, the thickness of the substrate on which a semiconductor layer is epitaxially grown is considerably larger than that of the epitaxially-grown semiconductor layer. For this reason, the ease with which the substrate is cleaved is especially important. GaAs or other materials, which are cleaved easily, is used as a substrate for a semiconductor laser formed of the III-V group such as AlGaAs or AlGaInP or the II-VI group such as ZnSSe or ZnCdSe, which are widely used or under development. Therefore, the resonator facets can be formed by cleaving.

In view of the fact that a short wavelength light emission is required of a semiconductor light emitting device such as a semiconductor laser, a semiconductor laser using a III-V compound semiconductor containing a III-group element of {Ga, Al, In} and a V-group element of N (nitrogen), which is capable of emitting in blue to ultra-violet, is desired. In this case, epitaxial growth of a {Ga, Al, In}—N compound semiconductor layer using an $MgAl_2O_4$ or an LGO (that is, $LiGaO_2$) crystal as a substrate, which is capable of being cleaved, has been attempted.

Suppose a compound semiconductor layer containing any one of {Ga, Al, In} and N is grown epitaxially on a sapphire substrate to form an intended semiconductor laser, for example. Since there is a lack of a cleavage plane in the sapphire substrate that is coincidental with that of the compound semiconductor layer, it is difficult to form a facet by cleaving, unlike in the above-mentioned case.

SUMMARY OF THE INVENTION

An object of the present invention is to provide a semiconductor device and a method of fabricating the semiconductor device, in which a semiconductor laser or the like with a semiconductor layer of GaN or the like III-V compound is configured using a substrate lacking a cleavage plane coincidental with that of the semiconductor layer or a substrate having a resistance to cleavage or having a cleavage plane that is different from the easily-cleaved plane of the semiconductor layer, so that the breakage or cleavage step is conducted easily and accurately along the cleavage plane of the semiconductor layer.

According to the present invention, there is provided a semiconductor device comprising a substrate and at least one layer composed of a compound semiconductor containing N and at least one of the elements selected from {Ga, Al, In} on the substrate wherein the layer composed of a compound semiconductor having a pair of facets of {11–20} planes, which is shown in the figure as 11$\overline{2}$0, or a plane within ±5 degree off from the {11–20} plane.

According to the other present invention, there is provided a method of fabricating a semiconductor device comprising forming at least one semiconductor layer on one surface of a substrate, forming a groove in the other surface of the substrate in such a shape as to concentrate the stress at a bottom portion of the groove, and breaking the substrate into a plurality of pieces at the groove while breaking the semiconductor layer.

The semiconductor device according to the present invention is made up of a semiconductor layer of a compound of III-V group containing at least one of the elements {Ga, Al, In} and N (i.e. GaN-group semiconductor). In this case, the facets of the semiconductor layer are configured in the {11–20} plane. The inventors have found that the {11–20} plane is superior for cleavage, and it has become possible to configure a semiconductor laser having a superior light emission characteristic by using such a plane as the facets of a resonator of a semiconductor laser.

As described above, the {11–20} plane has a superior cleaving characteristic. This may be understood from the fact that the (11–20) plane of the crystal or the {11–20} plane equivalent thereto of the III-V compound semiconductor layer containing at least one of the elements {Ga, Al, In} and N having a Wurtzite structure is coupled in a similar manner to the {110} plane which constitutes a cleavage plane of the zinc-blend of structure of the GaAs crystal.

It is within the scope of the present invention that a plane substantially equivalent to the {11–20} plane, such as a plane inclined about 5 degree from the {11–20} plane is also regarded as a {11–20} plane.

The method of the invention is such that even when the substrate does not have any plane which is superior in its cleaving characteristic coinciding with a plane that is superior in cleaving characteristics of a semiconductor layer epitaxially grown thereon, the substrate can still be broken with a positive result. As a result, the semiconductor layer thereon can also be broken with superior cleaving characteristics.

DETAILED DESCRIPTION OF THE PREFERRED EMBODIMENTS

Figure 1:
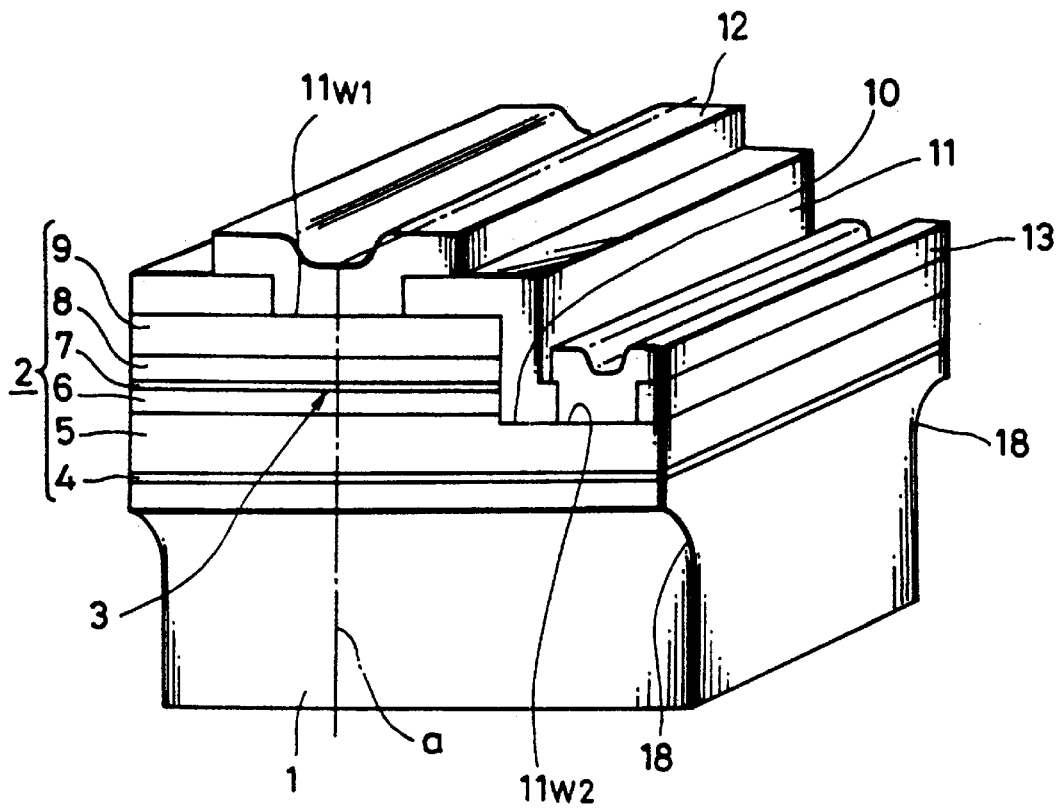
FIG. 1 is a perspective view showing an example of a semiconductor device according to the present invention.

An embodiment of the present invention will be described. FIG. 1 is a perspective view schematically showing an example of a semiconductor device according to the present invention.

According to the invention, a compound semiconductor layer 2 containing at least one of the elements {Ga, Al, In} and N is formed on a substrate 1. This example represents an application of the invention to a GaN-group semiconductor laser, in which case a semiconductor layer 2 including a stack of a plurality of semiconductor layers constituting a GaN-group semiconductor light-emitting device such as a semiconductor laser is formed on the substrate 1 which is made of sapphire or the like. The opposite facets 3 (of which only the front facet is shown in FIG. 1) of the semiconductor layer 2 constituting a laser resonator are a pair of {11–20} planes that are substantially perpendicular to the substrate 1.

To facilitate understanding of the device of the invention, an exemplary method of fabricating a semiconductor device according to the invention will be explained with reference to the perspective views of FIGS. 2 to 4. As shown in the sectional view of FIG. 2 taken along the broken line a in FIG. 1, a buffer layer 4 of GaN is epitaxially grown by 30 nm, for example, as required on the {0001} plane or the {1–100} plane of the main surface of the sapphire substrate 1. Then, using the same epitaxial growth steps as above, there are formed on the substrate 1 a layer 5 of a first conductivity type, for example, an n-type electrode contact layer 5 that is about 3 $\mu$m thick and doped with n-type impurities Si, an n-type first cladding layer 6 having a thickness of about 0.5$\mu$m and made of AlGaN doped with n-type impurities Si, an active layer 7 about 0.05 $\mu$m thick made of GaN that is low in n-type impurities concentration or is non-doped, a second cladding layer 8 of about 0.5 $\mu$m made of AlGaN doped with p-type impurities Mg as a second conduction type, and a cap layer 9 of about 1.0 $\mu$m in thickness made of GaN doped with p-type impurities Mg. These semiconductor layers 3 to 9 can be epitaxially grown by MOCVD (Metal Organic Chemical Vapor Deposition) or MBE (Molecular Beam Epitaxy).

The GaN-group semiconductor layer 2, that is epitaxially grown in this way on the {0001} plane or the {1–100} plane of the main surface 1a of the sapphire substrate 1, has a main surface of the plane {0001} or {1–100} the same as the substrate 1, but which is rotated by 30 degree with respect to the sapphire substrate 1. In other words, the epitaxial growth proceeds while the (11–20) plane (plane a) of the GaN-group semiconductor layer 2 is perpendicular to the plane 1a of the sapphire substrate 1 and in parallel with the (10–10) plane (plane m) of the sapphire substrate 1.

Figure 2:
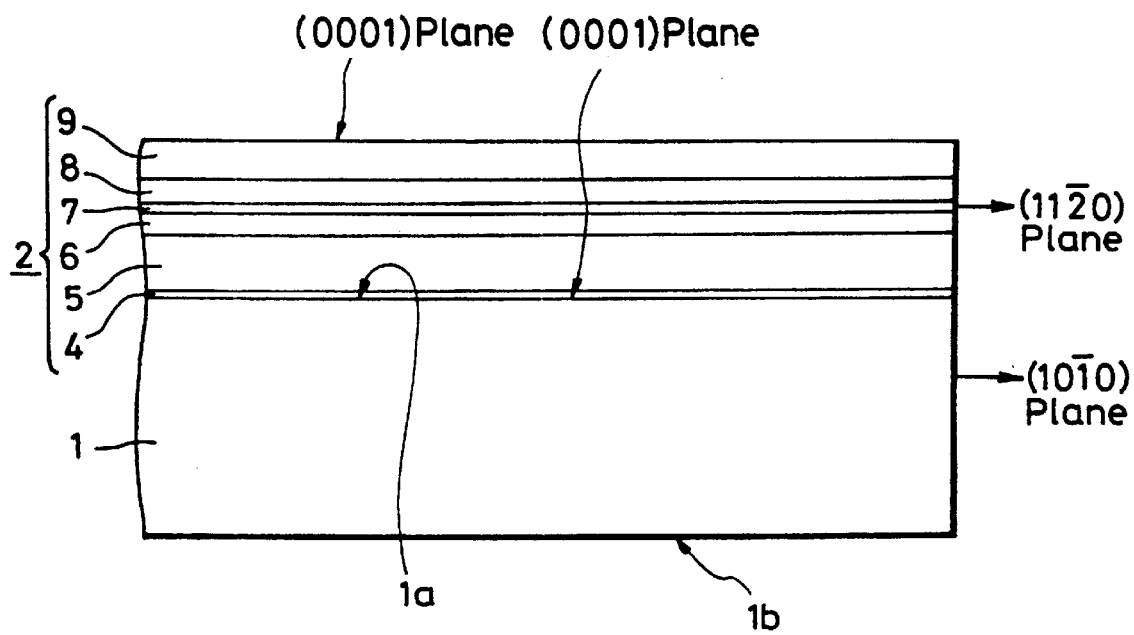
FIG. 2 is a side sectional view showing a step of an exemplary method of fabricating a semiconductor device according to the present invention.
Figure 3:
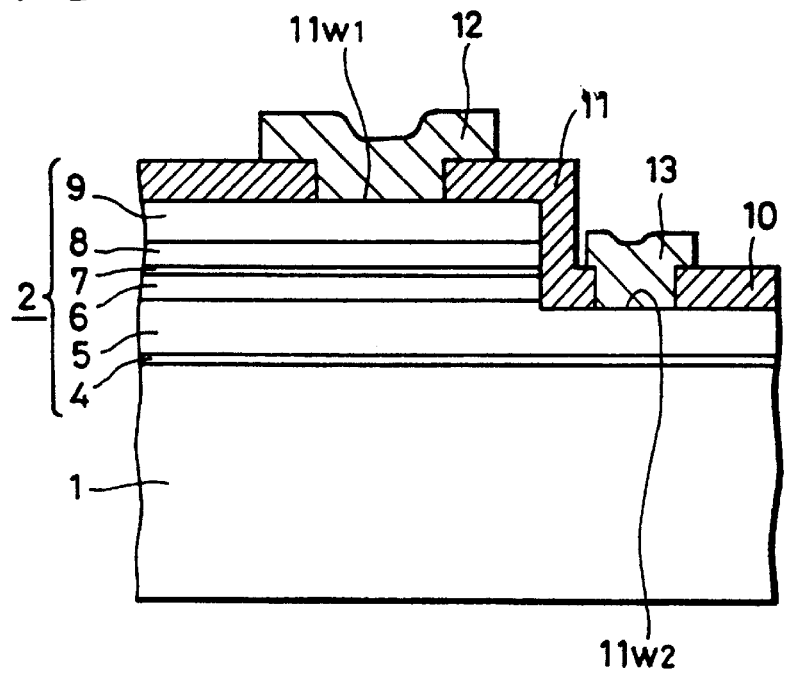
FIG. 3 is a side sectional view showing a step of an exemplary method of fabricating a semiconductor device according to the present invention.

As shown in FIG. 3 representing a section perpendicular to the section of FIG. 2, an electrode contact groove 10 is formed in a stripe by removing a part of the layers 6–9 and exposing a part of the electrode contact layer 5 in a direction at an angle to or perpendicular to the {11–20} plane by chemical wet etching or dry etching such as RIE from the surface of the cap layer 9. An insulating layer 11 of SiO$_2$ or the like is formed by sputtering or CVD,(,Chemical Vapor Deposition) over the entire surface of the cap layer 9 including the side surfaces in the groove 10. After that, an electrode contact window 11w1 is formed in a stripe parallel to the direction of the groove 10, i.e., in a direction at an angle or perpendicular to the {11–20} plane on the insulating film 11 on the cap layer 9. The other electrode contact window 11w2 is formed in the insulating film 11 on the electrode contact layer 5 in the groove 10. The windows 11w1 and 11w2 are formed by pattern etching using photolithography, for example.

An Au electrode 12, for example, is deposited in ohmic contact with the cap layer 9 through the electrode contact window 11w1. On the other hand, a stack electrode 13 constituting metal layers of Ti, Al and Au which are sequentially deposited is formed in ohmic contact with the electrode contact layer 5 through the other electrode contact window 11w2. Then the whole assembly is annealed.

Figure 4:
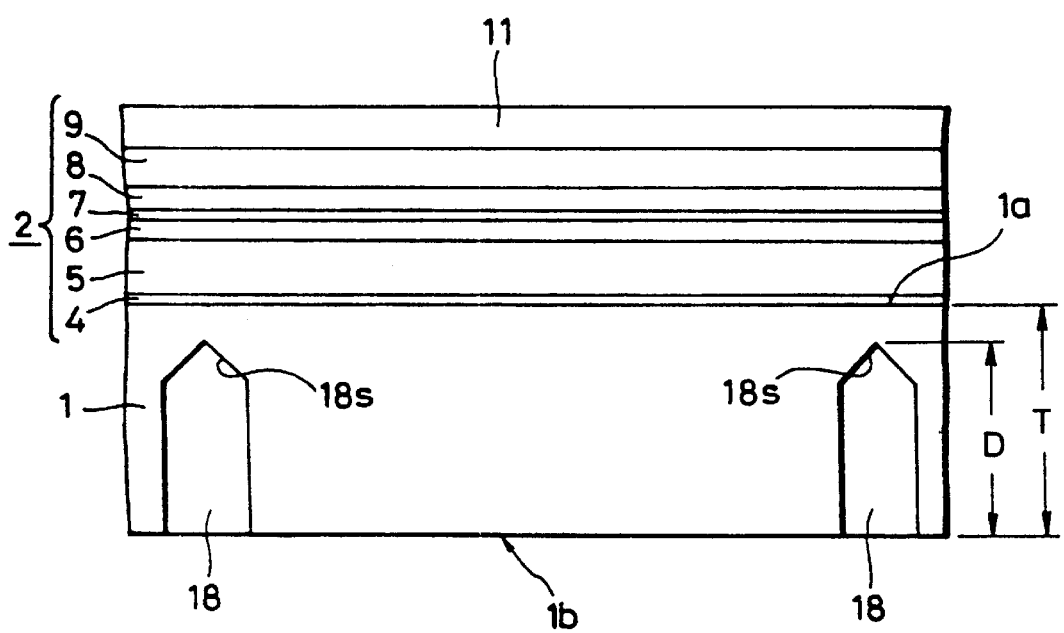
FIG. 4 is a side sectional view showing a step of an exemplary method of fabricating a semiconductor device according to the present invention

As seen from FIG. 4 showing a sectional view in the same plane as FIG. 2, i.e., perpendicular to FIG. 3, two or more strip shaped grooves 18 are cut along the direction parallel to the (11–20) plane or an equivalent {11–20} plane of the semiconductor layer 2. The grooves 18 can be formed by slicing, for example. The width of the opening of each of the grooves of the substrate surface 1b is as wide as 20 $\mu$m to 200 $\mu$m. A bottom section 18S extending along the {11–20} plane of the semiconductor layer 2 is formed to concentrate the stress.

The depth of the grooves 18 is such that the grooves 18 do not reach to the semiconductor layer 2. Assuming that the thickness of the substrate 1 is T and the depth of the substrate grooves D, then the relations 0<T–D≦150 $\mu$m, or 0<T–D≦T/2 are to be met.

Figure 5A:
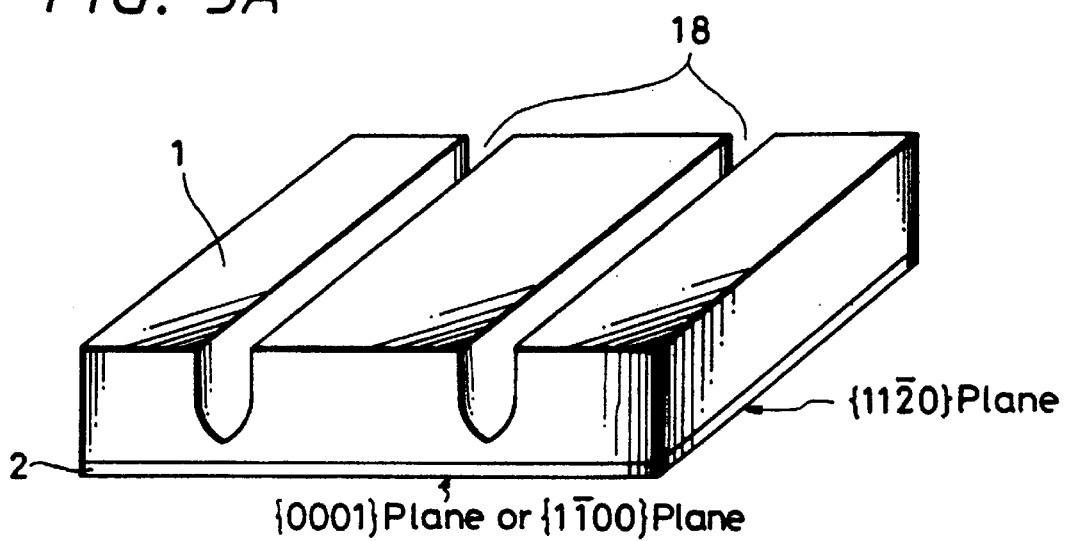
FIGS. 5A, 5B, and 5C are perspective views showing exemplary shapes of the grooves formed in a substrate by a method of fabricating a semiconductor according to the invention.
Figure 5B:
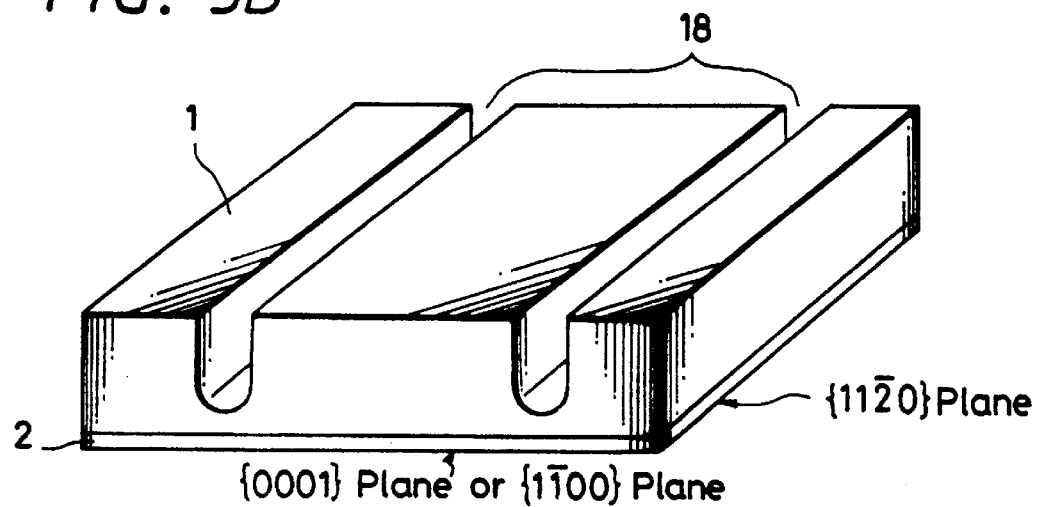
Figure 5C:
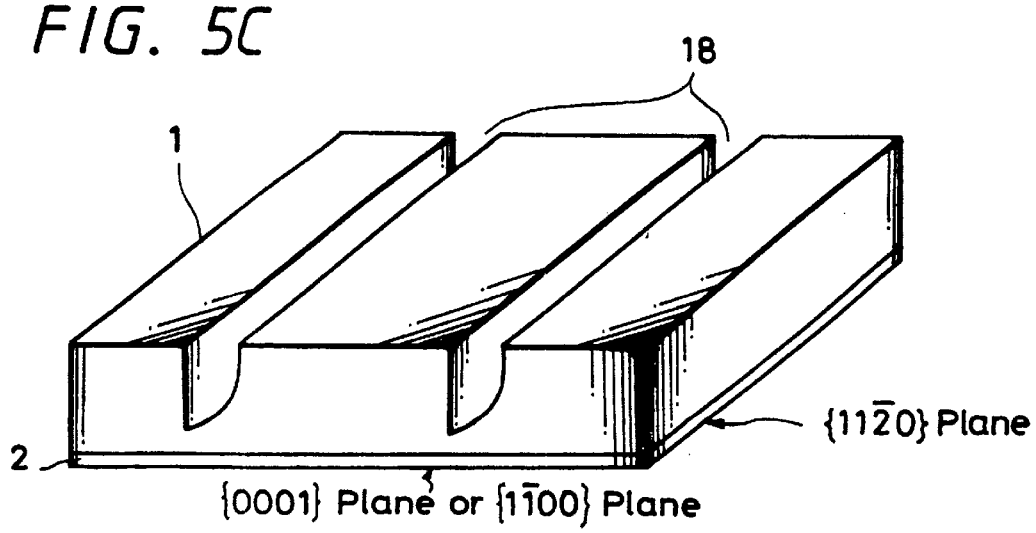

The sectional view of the grooves 18, as shown in the perspective views taken from the reverse side of the substrate 1 in FIG. 5, for example, may assume various shapes such as a V-shaped section as shown in FIG. 5A, a U-shaped section as shown in FIG. 5B or with a vertical side surface as shown in FIG. 5C. A sharp portion such as shown in FIGS. 5A and 5C extending linearly along the {11–20} plane of the semiconductor layer 2 is formed in the bottom section 18S of the groove 18. Stress is concentrated in this sharp portion of the bottom section After that, an external force is applied to the substrate 1 formed with the semiconductor layer 2 while applying a tension along the surface thereof For example, an external mechanical stress, thermal stress or ultrasonic wave is exerted in such a manner as to bend the substrate 1. Doing so causes stress to be concentrated in the bottom of the grooves 18. Consequently, as shown in FIG. 1, the substrate 1 is broken along the grooves 18, with the result that the semiconductor layer 2 is also broken along the grooves 18 thereby to produce semiconductor substrate chips. Since a {11–20} plane of the semiconductor layer 2 can be cleaved easily along the grooves 18, the opposed facets 3 having the superior surface characteristic due to the {11–20} plane are formed on the semiconductor layer 2.

The above-mentioned breakage preferably occurs from the semiconductor layer 2.

This breakage may be conducted at a temperature higher than room temperature, preferably, 150° C. or higher, as near to the epitaxial growth temperature as possible at 300° C. or more where elasticity of the substrate 1 decreases but at a temperature lower than that for epitaxial growth of the semiconductor layer 2.

The reason why the breakage is preferably conducted at a temperature as near to the epitaxial growth temperature for the semiconductor layer 2 as possible will be explained. The substrate 1 and the semiconductor layer 2 are preferably broken integrally. In the case where an elastic strain exists due to lattice mismatch between the semiconductor layer 2 and the substrate 1, however, the substrate 1 and the semiconductor layer 2 are hard to break integrally. The temperature for epitaxial growth of the semiconductor layer 2 on the substrate 1 is generally considered to be the temperature where the strain due to the lattice mismatch is lowest. At the temperature near to the epitaxial growth temperature, therefore, the strain between the semiconductor layer 2 and the substrate 1 is reduced. At such a temperature, therefore, the semiconductor layer 2 and the substrate 1 are comparatively easily broken integrally with each other.

As described above, breakage with a low elasticity characteristic ensures that the breakage extends continuously over the substrate 1 and the semiconductor layer 2.

It is already reported that the strength of sapphire becomes lowest by increasing the temperature from 300° C. to 600° C., for example. (A. H. Heuer and J. P. Roberts, "Temperature Dependence of the Strength of Corundum Single Crystals", American Ceramic Society Bulletin, 47(4) (1968) 354.))

Figure 6:
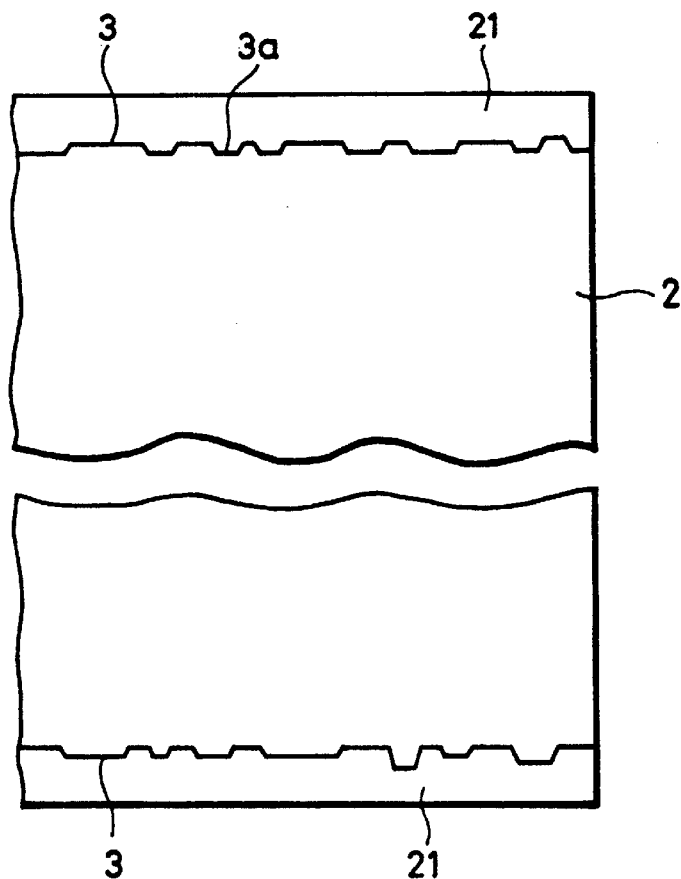
FIG. 6 is a schematic sectional plan view in one step of one example of the manufacturing method of the present invention.

The facet 3 thus formed along the {11–20} plane is easy to cleave, and therefore assures assures that an optically superior flat surface is formed. Nevertheless, as shown in FIG. 6 with a schematic sectional plan view of the semiconductor layer 2, a minute unevenness may occur due to atomic steps. Thus, to achieve a smooth mirror face of the surface by filling the minute irregularities 3$a$, the insulating surface layer 21 is clad and formed on the facet. The surface layer 21 is clad at least across that portion of the facet that acts as the resonator, that is, the surface layer 21 is coated on at least the end face of the active layer 7 which is the light emitting layer, and on the layer which restricts spreading of the light, for example, the first and second clad layers 6 and 8.

The material constituting the surface layer 21 is clad and formed by vacuum deposition, sputtering, or the CVD method with, for example, aluminum-nitride AlN having a refraction factor equal or as close as possible to that of the active layer 7 and that of the layers for confining the light on both sides of the active layer, for example, at least one of the first and second clad layers 6 and 8.

Figure 7:
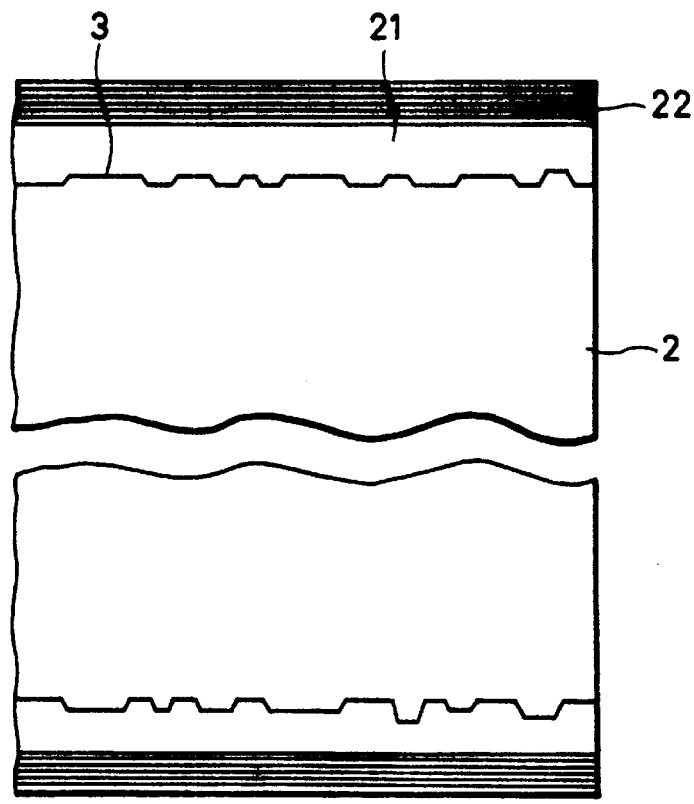
FIG. 7 is a schematic sectional plan view in one step of one example of the manufacturing method of the present invention.

Further, as shown in FIG. 7 with a similar schematic plan sectional view as FIG. 6, the outer face of the surface layer 21 can be clad and formed with a reflective multi layer 22 to increase the refraction factor on the end face 3.

In this way, a semiconductor laser according to the present invention is produced.

As described above, according to this invention, the facets 3 are formed along the grooves 18 formed in the substrate 1. The intervals between adjacent grooves 18, therefore, are selected in a manner to correspond to the length of the resonator of the finally-formed semiconductor laser.

In a semiconductor device according to this invention described above, the facets 3 of the semiconductor layer 2 constituting the resonator are formed by cleaving of the semiconductor layer 2. An optically superior flat surface can thus be formed. Further, as described above, in the case where an insulating film having the similar refractive index as the semiconductor layer 2 is formed on the end surfaces, the minute misalignment, which may be caused by atomic steps, i.e., which are present at the cleaved surfaces, can be buried into a smooth surface. The actual end surfaces (reflection surfaces on the two ends) of the resonator can thus be formed as a superior flat surface.

The drawings show the case in which the grooves 18 extend in parallel in one direction on the substrate 1. In the actual fabrication process of a semiconductor laser, however, chips from the substrate 1 are produced not only by breakage in the direction at an angle to the length of the resonator, i.e., in such a direction as to form the facets 3, but also by breakage along the direction perpendicular to such a direction. For this reason, grooves similar to the grooves 18 are formed in the substrate 1 at intervals corresponding to the chip width, i.e., at predetermined intervals in the direction perpendicular to the grooves 18. In this case, the semiconductor layer 2 may be broken in a plane that is hard to cleave. Since such a broken surface does not constitute the facets of the resonator, however, it is not required to be an optically superior surface and has no effect on the characteristics of the semiconductor laser.

As described above, according to this invention, the substrate 1, if made of sapphire, easily succumbs to cleavage. In spite of this, breakage along a predetermined direction can be positively accomplished by forming the grooves 18 and thereby causing the stress to be concentrated by appropriately selecting the sectional shape. The grooves 18 are thus formed along a plane that is easy to cleave in the semiconductor layer 2 above the substrate 1. In this way, at least the resonator can be formed in a predetermined crystal plane, i.e., in an easy-to-cleave surface of the semiconductor layer 2 without using the cleavage plane of the substrate 1.

Consequently, the invention is not limited to the above-mentioned sapphire substrate but is applicable also to substrates which easily succumb to being cleaved. In other words, the invention is not limited to the AlGaN-group semiconductor layer 2 constituting a semiconductor light-emitting device as in the above-described example.

The semiconductor layer 2 is configured of a compound semiconductor layer containing at least one of the elements {Ga, Al, In} and N. In the case where the surface layer 21 is deposited on the facets 3 for flattening the facets 3, the refractive indexes n of each semiconductor layer are 2.67 for GaN, 2.15 for AlN, and 2.85 to 3.05 for InN. In view of this, the surface layer 21 formed on the facets 3 is formed by vacuum vapor deposition, sputtering or CVD of AlN, GaN, InN, AlGaN or InGaN film having an intermediate value of refractive index at 1.5 to 3.05.

The foregoing explanation refers to a semiconductor laser of, what is called, double hetero structure type in which an active layer is held between cladding layers. The invention, however, is not confined to the above-mentioned semiconductor laser, but can be equally applied to what is called SCH (Separate Confinement Heterostructure) with an optical guide layer interposed between the active layer and the cladding layer. Various configurations, therefore, are possible using a semiconductor laser or a light-emitting diode.

It will thus be understood from the foregoing description that according to this invention, even in the case where the substrate does not have any plane so high in cleavage as to coincide with a high-cleavage plane of the semiconductor layer that is epitaxially grown on the substrate, the breakage can be accomplished positively. As a consequence, the semiconductor layer on the substrate can be broken along a plane of superior cleavage. Optically superior facets can thus be formed for the resonator. Also, a smooth surface superior to the one formed by etching, for example, can be formed. In addition, the fabrication process is simplified. A semiconductor device such as a semiconductor laser having intended characteristics with high reproducibility can thus be constructed in stable fashion.

Although other modifications and changes may be suggested by those skilled in the art, it is the intention of the inventors to embody within the patent warranted hereon all changes and modifications as reasonably and properly come within the scope of their contribution to the art.

We claim:

1. A semiconductor device comprising:

a substrate; and at least one layer composed of semiconductor compound containing N and at least one of the elements selected from {Ga, Al, In} on said substrate;

said at least one layer composed of semiconductor compound having a pair of facets within ±5 degree of a {11–20} plane of said semiconductor compound.

2. A semiconductor device as described in claim 1, wherein said pair of facets form a resonator of a semiconductor light emitting device.

3. A semiconductor device as described in claim 1, wherein said substrate is sapphire.

4. A semiconductor device as described in claim 1, wherein said substrate has a main surface in a {0001} plane.

5. A semiconductor device as described in claim 1, wherein said substrate has a main surface in a {1–100} plane.

6. A semiconductor device as described in claim 1, further comprising:

an insulating film on said pair of facets, said insulating film having a refractive index similar to a refractive index of said at least one layer.

7. A semiconductor device as described in claim 6, wherein said insulating film is of a compound of N and at least one material selected from the group consisting of Ga, Al and In.

8. A semiconductor device, comprising:

a sapphire substrate; and at least one layer of GaN on said substrate;

said at least one layer having a pair of facets within ±5 degree of a {11–20} plane.

* * * * *